United States Patent [19]

Peräläet al.

[11] Patent Number: 5,736,671
[45] Date of Patent: Apr. 7, 1998

[54] DOOR STRUCTURE OF A MAGNETICALLY-SHIELDED ROOM

[75] Inventors: Martti Perälä; Lasse Sohlström, both of Eura, Finland

[73] Assignee: Euroshield Oy, Eura, Finland

[21] Appl. No.: 578,011

[22] Filed: Dec. 26, 1995

[30] Foreign Application Priority Data

Dec. 27, 1994 [FI] Finland ............... 946100

[51] Int. Cl.[6] ............... H05K 9/00; E05D 15/10
[52] U.S. Cl. ............... 174/35 R; 49/209; 49/218; 49/449
[58] Field of Search ............... 292/36; 174/35 R, 174/35 GC, 35 MS; 361/816, 818, 800; 49/209, 211, 216, 218, 219, 449

[56] References Cited

U.S. PATENT DOCUMENTS

| | | | |
|---|---|---|---|
| 547,387 | 10/1895 | Taylor | 292/36 |
| 2,056,226 | 10/1936 | Mussey et al. | 292/36 |
| 2,347,705 | 5/1944 | Mosler et al. | 292/36 |
| 4,561,209 | 12/1985 | Sohlstrom | 49/246 |
| 4,753,038 | 6/1988 | Sohlstrom | 49/212 |
| 4,959,504 | 9/1990 | Yarger et al. | 174/35 MS |
| 5,017,736 | 5/1991 | Yarger et al. | 174/35 MS |
| 5,197,225 | 3/1993 | Yff | 49/223 |

FOREIGN PATENT DOCUMENTS

| | | |
|---|---|---|
| 0030529 | 6/1981 | European Pat. Off. |
| 63992 | 5/1983 | Finland. |
| 73043 | 4/1987 | Finland. |
| 3843130 | 9/1989 | Germany. |
| 3843130 A | 9/1989 | Germany. |
| 651354 | 9/1985 | Switzerland. |
| 2195057 | 3/1988 | United Kingdom. |

OTHER PUBLICATIONS

Japan Abstracts No. 6–33669, Feb. 8, 1994.

*Primary Examiner*—Kristine L. Kincaid
*Assistant Examiner*—Hung V. Ngo
*Attorney, Agent, or Firm*—Steinberg, Raskin & Davison, P.C.

[57] ABSTRACT

A door structure for a magnetically-shielded room intended to absorb interference magnetic fields, particularly very low frequency magnetic fields, and arranged to move substantially rectilinearly in the direction of the plane of the door leaf, and substantially rectilinearly in a direction which is perpendicular to the plane of the door leaf. The door leaf is attached to a support structure of the door leaf by hinge mechanisms so that the door leaf is movable perpendicular to the structure of the door leaf in order to provide a movement in a direction perpendicular to the plane of the door leaf. The door structure includes power transmission members arranged to exert an effect on press members on the edge areas of the door leaf such that the press members turn around hinging members whereby exposed μ metal sheet structure on the edge areas of the door leaf is pressed tightly against μ metal sheet structure of the shielding wall structure at an aperture in a wall of the magnetically-shielded room.

17 Claims, 4 Drawing Sheets

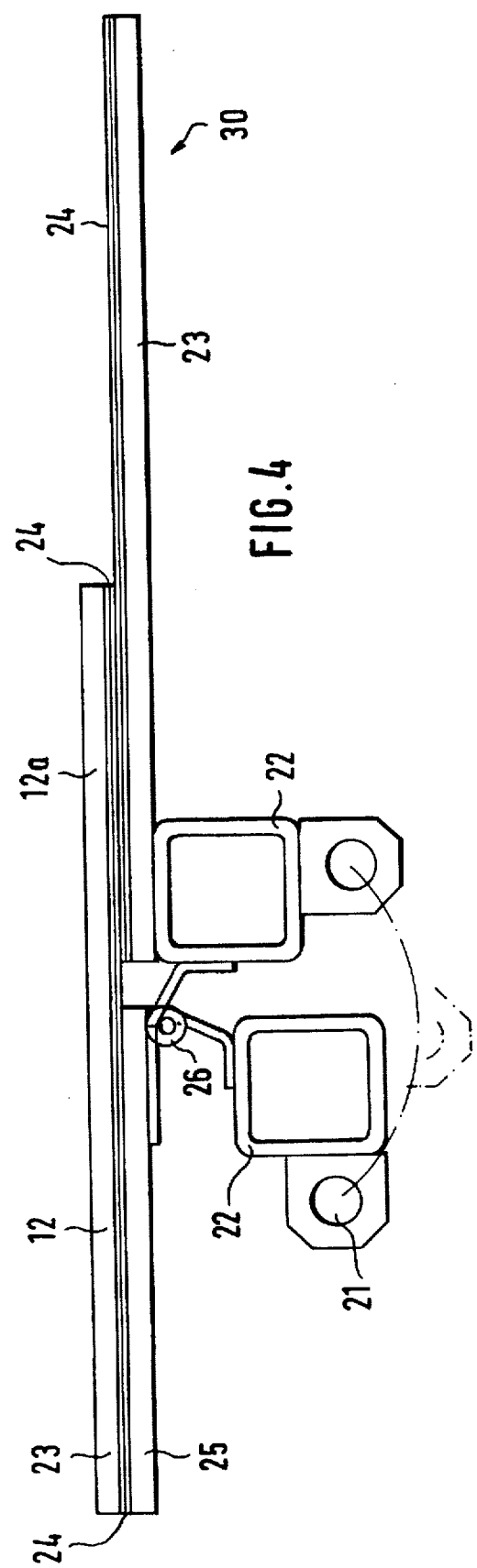

5,736,671

DOOR STRUCTURE OF A MAGNETICALLY-SHIELDED ROOM

FIELD OF THE INVENTION

The present invention relates to a door structure of a magnetically-shielded room intended for absorbing interference magnetic fields, particularly very low frequency magnetic fields, and which door structure can move substantially rectilinearly in the direction of the plane of the door leaf and substantially rectilinearly in a direction which is perpendicular to the plane of the door leaf.

BACKGROUND OF THE INVENTION

For providing an interference-shielded space, the function of the structures used to house the space can be to prevent penetration of external electromagnetic energy into the shielded space or also to limit the electromagnetic energy within a space surrounded by the structure by preventing leakage of an interfering field into the surroundings. Structures of this type are known in the art and they are generally used for shielding sensitive structures against electromagnetic radiation and for enabling measurements free of radio frequency interferences, e.g., in industries employing data transmission and high frequency technology, in research, and, e.g., in hospitals. Irrespective of the use of the shielded space, the most poorly absorbing part in the shielding is usually formed by the contact point between a door, window, hatch or equivalent element to be opened for access into the shielded space and the fixed structure.

To avoid the deterioration of the shielding properties of the door, the electric contact of the moving part of the door and the door frame, and the redundance path, when shielding against low-frequency magnetic field, is required to be as continuous as possible and correspond to the properties of the rest of the structure. The absorption properties of the joint between the door and the frame can be improved, above all at high frequencies, with a labyrinth structure positioned at the point of contact where, for ensuring the contact, knife-like contact tongues are pressed between the contact springs disposed in a runner running around the aperture.

However, in prior art door designs, the performance values achieved in practice have been limited by the fact that using a repeated labyrinth structure has not been possible, because of the requisite tight fits, so that the normal convenience of use of the door and the operation properties of a door hinged in a normal way are maintained. When an efficient and complicated labyrinth structure is used, the contact tongues penetrating between the springs tend to, owing to the tight fits, damage the sealing structure by urging the sealing springs off from their locations by means of the swivelling movement of a normally turning door, and on the other hand, closing such door requires enormous press force, e.g., from about 100 kp to about 150 kp.

Finnish Patent No. 63992, corresponding to U.S. Pat. No. 4,561,209 incorporated by reference, discloses a door in a structure intended for prevention of the transmission of interference fields in which the movement of the door is provided by a rotary movement around an axis determined by hinge means and by a substantially rectilinear movement producing a contact which prevents transmission of interference fields. It has, however turned out to be that, particularly in large-size door designs, the rotary movement around the axle is not the best possible solution. In such instances, the heavy weight of the door poses high requirements on the hinge means. Thus, the large forces and torques directed at the rotary hinging of the heavy door structure create more stress in the hinging than in light-weight door structures.

Finnish Patent No. 73043, corresponding to U.S. Pat. No. 4,753,038 incorporated by reference, discloses a door in a structure to prevent transmission of interference fields, particularly high-frequency electromagnetic fields, relative to which the door has been arranged to be moved with hinge means and whereby the door and/or fixed structure has/have been provided with members to have a contact between the door and the fixed structure to prevent the transmission of interference fields. The door has been arranged to move with the aid of first hinge means substantially rectilinearly in a direction which is in the direction of the normal to the plane of the door, and with the aid of second hinge means substantially in the direction of the plane of the door. The first hinge means comprise first coupling means and second coupling means, either of which having been disposed to move while in contact with the cooperative coupling means. The first coupling means consist of a toothed wheel and the second coupling means consist of a pinion rack, whereby the toothed wheel has been arranged to move along the teeth of the rack. The second hinge means comprise rollers supported by which the door has been arranged to move on a guide bar.

The interferences inhibiting precise magnetic measurements can be classified into two groups: those caused by humans and those cause by nature, such as the magnetic field of the earth. When moving far off from the sphere influenced by the humans, an environment is created in which the disturbances caused by humans are insignificant. In general, it is desirable to make measurements in a laboratory environment. Now, powerful interferences are caused, among other things, by lifts or elevators, vibrations of the constructional steels, passing vehicles, and electric apparatus. In a magnetically-shielded room, endeavors are made to absorb interferences of the laboratory surroundings to the extent that research applying the most sensitive measurement devices is possible in the "inner interiors" of the room.

Magnetic shielding is implemented utilizing three different methods. These are as follows: passive ferromagnetic shielding, swirl shielding, and active compensation of the interference field. The ferromagnetic shielding consists of one or more nested μ metal shells. Each wall is made of two μ metal layers, the metal strips of which are positioned, e.g., cross-wise. The μ metal layers have been mounted between two aluminum sheets (having thicknesses of, e.g., 2 mm and 5 mm). The 5 mm aluminum sheets serving as the support structure have been joined to each other to form a uniform structure conducting electricity well. In such a structure, the inducing swirls absorb the alternating current magnetic field which is trying to enter the interior. An active shielding is implemented with coils installed around the magnetic-shielded room, to which the electric current is conducted, the magnetic field generated by which is as great within the magnetic-shielded room but reverse in direction as the external interfering magnetic field trying to enter the room. The active shielding is efficient at low frequencies and its shielding capacity is limited merely by the noise of the magneto-meters and electronic apparatus used.

The properties of passive ferromagnetic shielding may be enhanced considerably by superposing a relatively large alternating current magnetic field ($H_s$=5 A/m, rms) into an interference, whereby the effective permeability of the μ metal increases significantly, thus causing an increase in the shielding factor. In modern English, this type of processing is called "shaking".

It is possible to shield against static and slowly varying magnetic fields on a large scale merely by building the walls of the space to be shielded from μ metal or by using active compensation of the magnetic field. A material of high permeability can be thought of acting as a good conductor concerning a magnetic field and shielding the space enclosed therewith by conducting the fields into itself. The shielding factor of the ferromagnetic shell is proportional to the permeability of the material and the thickness of the shell layer. By building a multiple-layer shield, a higher shielding factor can be obtained with the same quantity of material than by using one single screen of the same weight.

Shaking or superposing alternating current magnetic field on the walls of the shield has clearly been found to improve the shielding factor. The effective permeability of the μ metal has been found to be improved with shaking treatment into twice to seven times greater in 0 to 100 Hz frequency range. The shaking frequency can in practice be varied in the range 3 to 200 Hz. The most useful frequency is in general the 50 Hz mains frequency because the shaking causes a relatively strong interference field in a shielded space. On the mains frequency, the interference level has already been high, and preparations have to be made in any case to absorb the interferences, e.g. using filtering in the measurement apparatus. The shielding factor has been found to be improved both at interference frequencies above and below the shaking frequency.

If the walls of the shielded space have been built from a conductive material, the swirls produced in the shielding shell absorb the varying interference field within the room. It goes without saying that the static field is not affected by the swirl shielding at all. The swirls commence to exert their effect at frequencies at which the penetration depth of an interference field is of the order of the thickness of the shielding shell. As the frequency increases, the shielding factor caused by the swirls increases exponentially. The upper limit of the shielding factor is determined by the field entering the room through apertures and joints.

Active compensation apparatus of magnetic fields are used in a multitude of applications, not however in general in combination with passive shielding methods. The magnitude of an interference magnetic field is measured at a distance from the target to be shielded, with the purpose that the magnetic field produced by the compensation coil would have no effect on the measurement. The current of the compensation coil is controlled with a precise current generator so that it is directly proportional to the interference field being measured. An interference field may also be measured at a number of points, and the current of the compensation coils can be controlled according to the appropriately weighted mean of the measurement values.

If, in a magnetic shielding using merely active compensation, the interference magnetic field is measured in the proximity of a shielded space or therewithin, also the magnetic field being studied is compensated in addition to the interference field so that the closed control of the current of the compensation coils is not functional.

When active compensation is used in conjunction with passive magnetic shielding, a closed control of the current of the compensation coil is conceivable.

The current of the compensation coil is controlled by a closed control circuit which tends to maintain the measured magnetic field constant. After the measured magnetic field is stabilized, also the residual field prevailing in the magnetic-shielded space is constant.

In practice, the residual field cannot be turned completely into a constant field because the magnetic field provided by the compensation coil is not homogeneous in the shielded space.

When estimating the shielding factor of a magnetic-shielded room, three situations and shielding mechanisms differing from each other can be identified:

(a.) Shielding caused by a ferromagnetic material to the static field of the earth, that is, the static shielding.

(b.) Shielding caused by a ferromagnetic material against slowly varying interference fields (f<1 Hz), that is, so-called quasistatic shielding.

(c.) Combined effect of swirls and ferromagnetic shielding with increased frequency (f<1 Hz), that is, dynamic shielding.

The above frequency limits are exemplary and dependent on the thickness of the walls of the shield and the materials used.

An aperture in a wall of a magnetically-shielded room naturally exerts an effect on the magnetic field prevailing within the room. Indeed, the aperture in the wall impairs the shielding factor. As such, the door structure of a magnetically-shielded room is required to meet extremely high quality requirements if the shielding factor of the magnetically-shielded room is not allowed to deteriorate to an unusable condition.

The door designs disclosed in Finnish Patent Nos. 63992 and 73043 are appropriate for high frequencies, e.g., for 1 kHz frequencies and higher. However, the door structure of a magnetically-shielded door is required to be able to absorb magnetic fields of very low frequencies, whereby the frequency range from 0 Hz upwards varies in general to some 100 Hz. Therefore, the door designs disclosed in the Finnish Patent Nos. 63992 and 73043 are not appropriate for use as a door structure of a magnetically-shielded room.

OBJECTS AND SUMMARY OF THE INVENTION

Accordingly, it is an object of the present invention to provide a door structure which is particularly appropriate for use as a door structure for an aperture in the wall of a magnetically-shielded room.

A more specific object of the present invention is to produce a door structure wherein the shielding factor of a magnetically-shielded space defined in part by the door structure will not be greatly impaired.

The door structure of a magnetically-shielded room according to the present invention includes a door leaf attached to the structure of the door with a hinge mechanism so that the door leaf is able to move in a direction substantially perpendicular to the structure of the door in order to achieve a movement at fight angles to the plane of the door leaf. The door structure is provided with power transmission members adapted to exert an effect on press members on edge areas of the door leaf whereby the press members rotate around the hinging members. The μ metal sheet structure on the edge areas of the door leaf is arranged to be compressed tightly against the μ metal sheet structure corresponding to the shield wall structure at the aperture in a wall of the magnetically-shielded room.

BRIEF DESCRIPTION OF THE DRAWINGS

The following drawings are illustrative of embodiments of the invention and are not meant to limit the scope of the invention as encompassed by the claims.

FIG. 1b shows a top view of the door structure of FIG. 1a.

FIG. 2 shows a front view of the door structure of FIG. 1a.

FIG. 4 shows the detail A of FIG. 2 in an enlarged scale, with the press member both in its open position and in its closed position.

DETAILED DESCRIPTION OF THE INVENTION

Figure 1A:
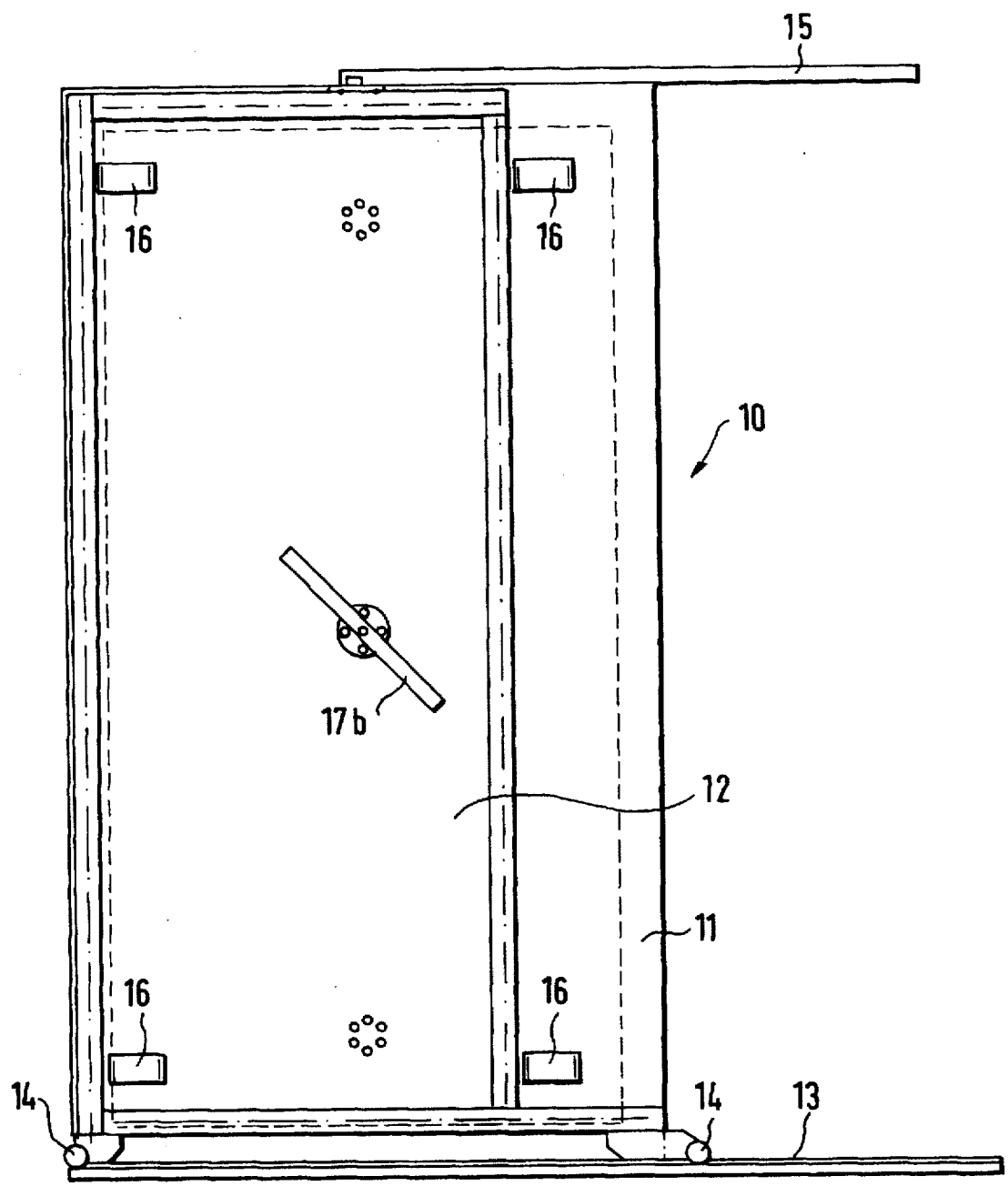
FIG. 1a shows a rear view of one embodiment of a door structure according to the invention.
Figure 1B:
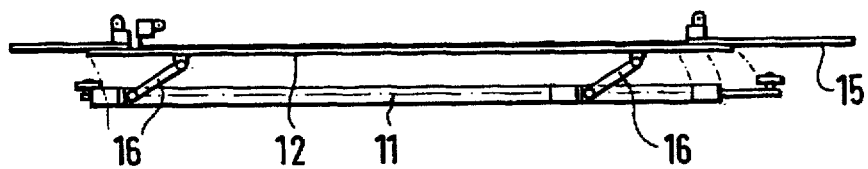
Figure 2:
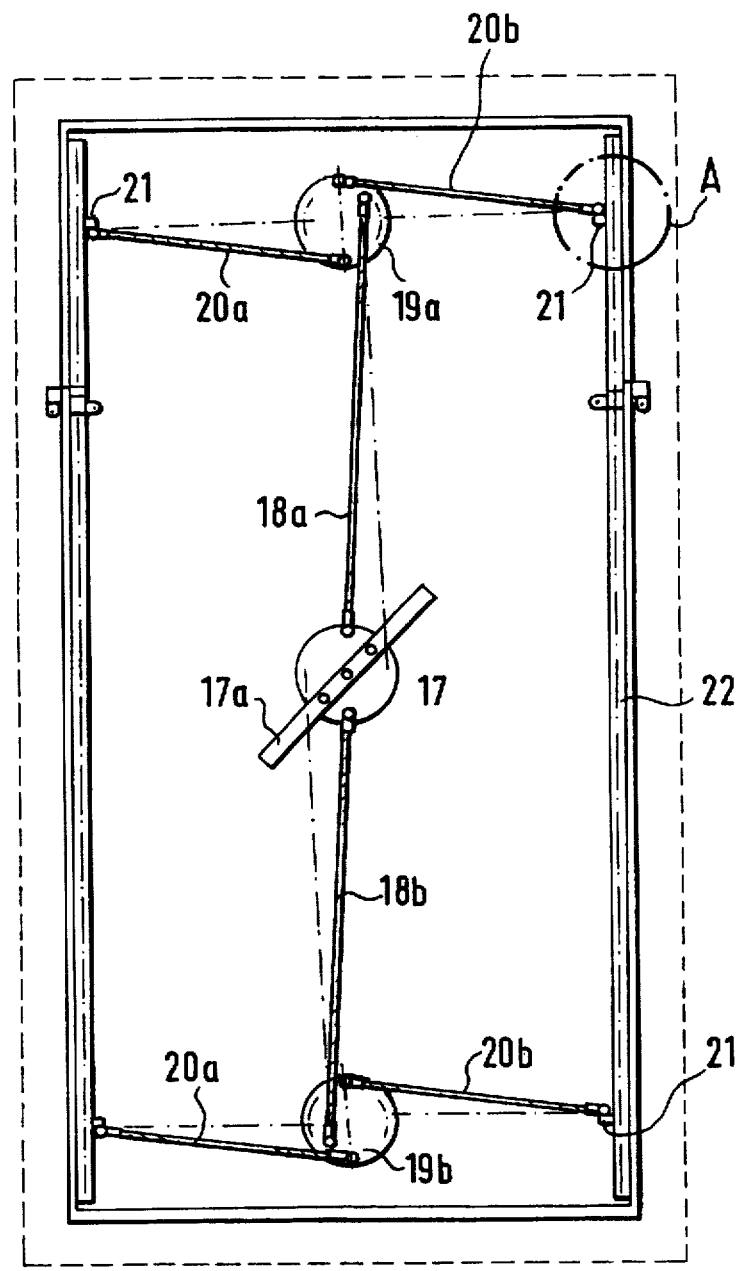

Referring to the accompanying drawings wherein the same reference numerals refer to the same or similar elements, the door structure in accordance with the invention shown in FIGS. 1a, 1b and 2 is generally indicated by reference numeral 10. The door structure 10 comprises a support structure 11 of the door leaf and the actual door leaf 12. The support structure 11 of the door leaf 12 is disposed at a lower part thereof on lower guide means such as a guiding rail 13 with the aid of rollers 14. At the upper part of the structure 11 of the door leaf 12, the structure 11 of the door leaf is arranged to glide in upper guide means such as a guide rail 15. The lower and upper guide means facilitate movement of the support structure 11. The door leaf 12 is attached to the structure 11 of the door leaf 12 with hinge mechanisms 16 so that the door leaf 12 is able to move in a direction substantially perpendicular to the structure 11 of the door leaf 12, i.e., away therefrom. In the embodiments shown in the drawings, the door leaf 12 is planar and attached to the planar support structure 11 of the door leaf 12 at four different points by the hinge mechanisms 16.

In the approximate center part of the door leaf 12, a center member 17 is disposed and includes a pair of attached handles 17a and 17b. Handle 17a is situated on the side of the door leaf 12 and handle 17b is situated on an opposite side of the door leaf facing the support structure 11 of the door leaf. On the surface of the center member 17 of the door leaf 12, arms 18a and 18b are attached, of which a first arm 18a is directed upwards to a center part 19a and the other arm 18b is directed downwards to a center part 19b. Arms 20a, 20b are attached to the center parts 19a and 19b, respectively, and are directed from the respective center parts 19a and 19b to the lateral sides of the door leaf 12 towards a joint 21 shown in FIG. 4. The joint 21 is attached to press members 22 extending along the edges of the door leaf 12. The assembly of center member 17, handles 17a, 17b, arms 18a, 18b, center parts 19a, 19b, arms 20a, 20b, joints 21 and hinges 26 to be described below, constitute power transmission means for providing power to cause the press members 22 to move into pressing engagement with the shielding wall structure of the room.

Figure 3:
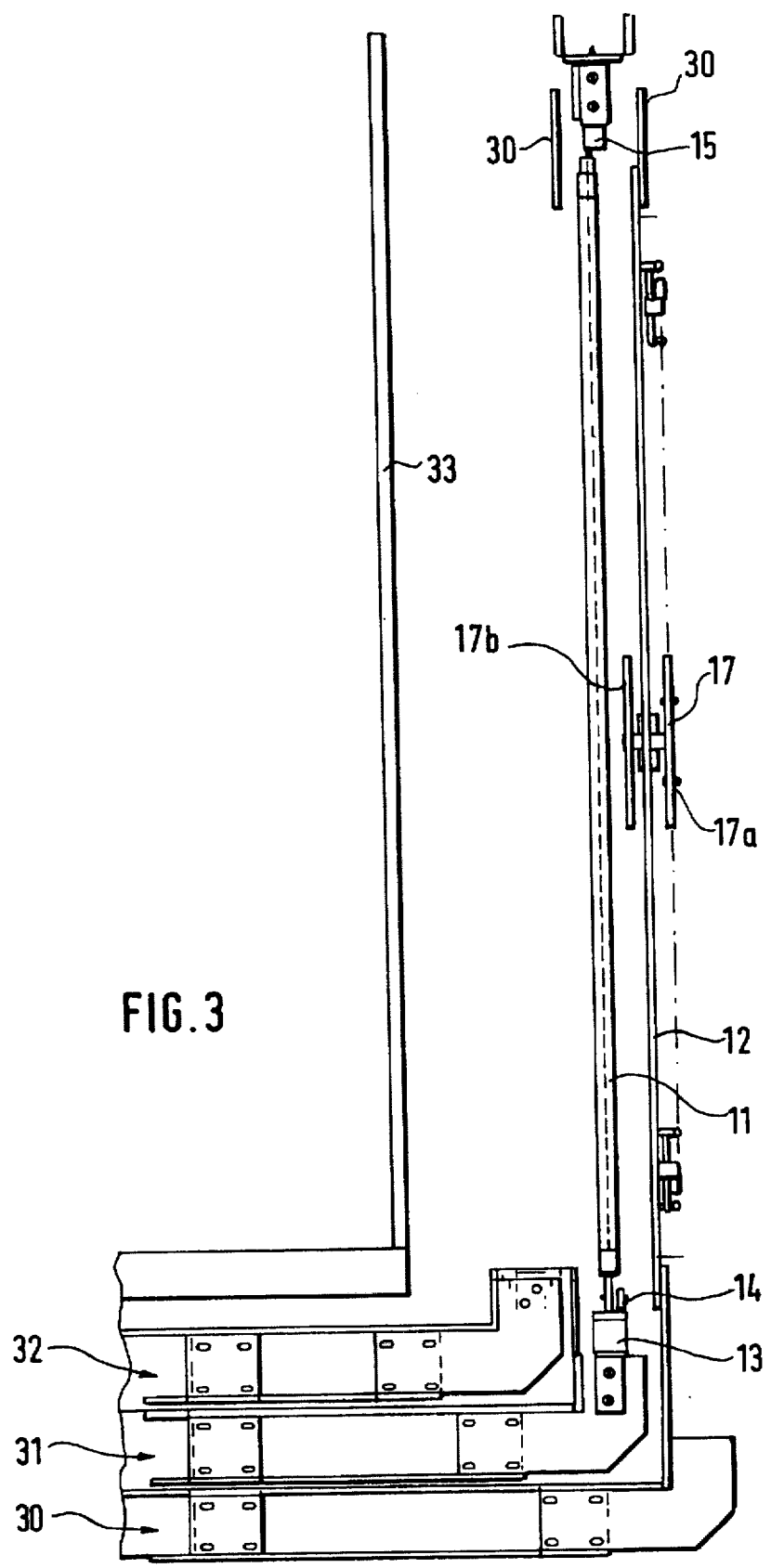
FIG. 3 shows an elevational view of the door structure of the invention applied in a magnetically-shielded room.

FIG. 3 shows the three-ply shield wall structure of a magnetically-shielded room, which is designated by reference numerals 30,31 and 32. The wall of the inner room of the magnetically-shielded room is designated by reference numeral 33.

As best shown in FIG. 4, the door leaf 12 comprises a laminated structure comprising a first aluminum sheet 23 having a thickness of about 5 mm, a two-ply aluminum μ metal sheet 24 adjacent thereto and having an overall thickness of about 2 mm, and a second aluminum sheet 25 adjacent to the two-ply aluminum μ metal sheet and having a thickness of about 5 mm. Edge areas 12a of the door leaf 12 lack, however, the innermost aluminum sheet 25, and the inner surface of the edge area 12a is constituted by the two-ply μ metal sheet 24 which is thus exposed. The arms 20a and 20b exert an effect on the press members 22 with the aid of joints 21 such that the press members 22 rotate about the hinges 26, whereby the exposed portion of the μ metal sheet 24 of the edge areas 12a of the door leaf 12 is tightly pressed against the exposed portion of the μ metal sheet of the shield wall structure 30 at an aperture in a wall of the magnetically-shielded room, as best seen in FIG. 3.

The functioning of the door structure in accordance with the invention is as follows. The door structure 10 is moved laterally in the manner of a conventional sliding door, whereby the support structure 11 of the door leaf 12 moves along the lower guide 13 and the upper guide 15, covering the door aperture of the magnetically-shielded room. Thereafter, the door leaf 12 moves, upon actuation via the hinged mechanisms 16, whereby the door leaf 12 performs a movement in a direction perpendicular to the surface of the door leaf 12 and, at the same time, the door leaf 12 moves, relative to the structure 11 of the door leaf, away therefrom. Thereafter, the handle 17a in the center member 17 is turned, whereby the movement of the arms 18a and 18b is transmitted to the center parts 19a and 19b, and further, transmitted by the center parts 19a and 19b to the arms 20a and 20b which turn, with the aid of joints 21, the press members 22 of the door leaf 12 around the hinged mechanism 26 so that the two-ply μ metal sheet 24 in the edge areas 12a of the door leaf 12 is pressed tightly against the two-ply μ metal sheet 24 of the shield structure 30 on the edge of the door aperture of the magnetically-shielded room. It is to be noted that the shield wall structure 30,31,32 of the magnetic-shielded room otherwise consists of a laminated structure as usual, comprising an outer aluminum sheet 23 having a thickness of about 5 mm, a two-ply μ metal sheet 24 having a thickness of about 2 mm, and an inner aluminum sheet 25 having a thickness of about 2 mm. On the edge of the door aperture, the innermost aluminum sheet 25 is not provided at a distance equivalent to the width of the edge area 12a of the door leaf 12.

In the foregoing, merely the principle design of the invention and an advantageous embodiment thereof are presented, and it is obvious to a person skilled in the art that a great number of modifications can be made therein within the scope of the inventive idea presented in the accompanying claims.

The examples provided above are not meant to be exclusive. Many other variations of the present invention would be obvious to those skilled in the art, and are contemplated to be within the scope of the appended claims.

We claim:

1. A door structure for a magnetically-shielded room for sealing an aperture of the room and for engaging with shielding wall structure of the room including a sheet of μ metal exposed at portions thereof, comprising a door leaf having a sheet of μ metal with exposed portions at edge areas of said door leaf, a door leaf support structure for supporting said door leaf, said door leaf and said door leaf support structure being movable between a first position in which said door leaf and said door leaf support structure are in front of the aperture of the room and a second position in which said door leaf and said door leaf support structure are away from the aperture of the room, hinge means for hingedly connecting said door leaf to said door leaf support structure such that said door leaf is movable in a direction perpendicular to and away from said door leaf support structure into the aperture of the room when said door leaf and said door leaf support structure are in said first position, and pressing means for pressing said edge areas of said door leaf against the shielding wall structure of the room when said door leaf is in the aperture of the room such that said exposed µ metal sheet portions at said edge areas engage with the exposed µ metal sheet portions of the shielding wall structure.

2. The door structure of claim 1, wherein said pressing means comprise press members arranged at said edge areas of said door leaf and power transmission means for providing power to cause said press members to move into pressing engagement with the shielding wall structure of the room.

3. The door structure of claim 2, wherein said power transmission means comprise a center member arranged in a central area of said door leaf, said center member including a rotatable handle, first and second center parts spaced from said center member, a first arm extending from said center member to said first center part a second arm extending from said center member to said second center part, third and fourth arms attached to each of said first and second center parts, said third arms extending from said first and second center parts to a first one of said edge areas of said door leaf and said fourth arms extending from said first and second center parts to a second one of said edge areas, and joints arranged at said edge areas of said door leaf for connecting said third and fourth arms to said press members, said joints and said press members being rotatable upon rotation of said handle.

4. The door structure of claim 2, wherein said power transmission means are arranged in the immediate proximity of said edge areas of said door leaf.

5. The door structure of claim 3, wherein said handle extends from a first side of said door leaf, further comprising an additional rotatable handle connected to said center member, said additional handle extending from a second, opposite side of said door leaf facing said door leaf support structure.

6. The door structure of claim 1, wherein said door leaf comprises a laminated structure comprising a first aluminum sheet, a two-ply µ metal sheet adjacent said first aluminum sheet and a second aluminum sheet adjacent said two-ply µ metal sheet, said second aluminum sheet covering said two-ply µ metal sheet except at said exposed portions at said edge areas of said door leaf.

7. The door structure of claim 1, further comprising lower guide means for guiding movement of a lower end of said door leaf support structure, and upper guide means for guiding movement of an upper end of said door leaf support structure.

8. The door structure of claim 1, wherein said door leaf and said door leaf support structure are substantially planar.

9. The door structure of claim 3, wherein said power transmission means further comprise hinges for hingedly connecting said press members to said door leaf.

10. The door structure of claim 7, wherein said lower guide mean comprise a guide rail, said lower end of said door leaf support structure being arranged to glide in said guide rail.

11. The door structure of claim 7, wherein said upper guide means comprise a guide rail, said upper end of said door leaf support structure being arranged to glide in said guide rail.

12. The door structure of claim 1, wherein said door leaf structure is arranged substantially in opposed relationship to said door leaf.

13. The door structure of claim 2, wherein said edge areas of said door leaf constitute lateral sides of said door leaf, one of said press members extending along substantially the entire length of a respective one of said lateral sides of said door leaf.

14. The door structure of claim 3, wherein said power transmission means further comprise hinges for hingedly connecting said press members to a first side of said door leaf, said edge areas of said door leaf being situated on a second side of said door leaf opposite said first side and the exposed µ metal sheet portions of the shielding wall structure being situated on a first side thereof such that said press members are pressed upon rotation of said handle against a second side of shielding wall structure opposite said first side thereof.

15. The door structure of claim 1, wherein said hinge means comprise a plurality of hinges interposed between said door leaf support structure and said door leaf.

16. The door structure of claim 15, wherein each of said hinges has a first portion connected to said door leaf and a second portion connected to said door leaf support structure.

17. The door structure of claim 1, wherein said door leaf support structure is arranged at least partially alongside said door leaf.

* * * * *